United States Patent [19]

Foster

[11] Patent Number: 5,011,725
[45] Date of Patent: Apr. 30, 1991

[54] SUBSTRATES WITH DENSE METAL VIAS PRODUCED AS CO-SINTERED AND POROUS BACK-FILLED VIAS

[75] Inventor: Brian C. Foster, Sutton, Mass.

[73] Assignee: Ceramics Process Systems Corp., Milford, Mass.

[21] Appl. No.: 319,625

[22] Filed: Mar. 6, 1989

Related U.S. Application Data

[63] Continuation-in-part of Ser. No. 53,323, May 22, 1987, and Ser. No. 207,394, Jun. 16, 1988.

[51] Int. Cl.$^5$ ............................................. B32B 3/00
[52] U.S. Cl. ................................... 428/137; 428/141; 428/209; 428/402; 428/403; 428/432; 428/901; 252/514; 252/518; 106/1.14; 106/1.15; 106/1.18; 106/1.19; 106/1.21; 156/89
[58] Field of Search ............... 252/514, 518; 106/1.14, 106/1.15, 1.18, 1.19, 1.21; 428/209, 144, 402, 403, 432, 901, 137; 156/89

[56] References Cited

U.S. PATENT DOCUMENTS

| | | | |
|---|---|---|---|
| 4,020,234 | 4/1977 | Gardner | 428/446 |
| 4,207,369 | 6/1980 | Kazmierowicz | 428/457 |
| 4,273,822 | 6/1981 | Bube | 428/216 |
| 4,415,624 | 11/1983 | Prabhu et al. | 428/209 |
| 4,617,237 | 10/1986 | Gupta et al. | 428/446 |
| 4,733,328 | 3/1988 | Blazej | 361/320 |
| 4,847,003 | 7/1989 | Palanisamy | 252/514 |

Primary Examiner—Patrick J. Ryan

[57] ABSTRACT

Dense metal vias in pure alumina substrates are derived from a metallization composition having 80-97% refractory metal, 2-15% alumina, 0.05-5% sintering aid, and 0-5% bonding additive; it has been found that for alumina contents greater than about 12%, a bonding additive is not required. The same compositions, absent the sintering aid, can be used to form bimetallic vias; these vias include a porous metal network where the pores are infiltrated with another metal, for example, porous tungsten infiltrated with copper.

20 Claims, 2 Drawing Sheets

SUBSTRATES WITH DENSE METAL VIAS PRODUCED AS CO-SINTERED AND POROUS BACK-FILLED VIAS

This application is a continuation-in-part of co-pending application Ser. No. 053,323, filed 22 May 1987, and Ser. No. 207,394, filed 16 June 1988, both of which are incorporated herein by reference.

BACKGROUND OF THE INVENTION

1. The Field of the Invention

This invention relates to conductive metal vias in ceramic substrates and methods for producing the same, including paste compositions for forming the same.

2. The State of the Art

Integrated circuit packages are one of the most important applications for high performance ceramics in the microelectronics industry; circuit packages are single- or multilayer passive devices having an insulating or dielectric portion and an electrical or conductor portion. The dielectric portion is usually in the geometry of a substrate layer, and the conductor portion can exist as a circuit pattern on the substrate surface and/or as a conduit or via connecting the surfaces.

Integrated circuit packages serve two essential functions. The primary function is as a passive electronic device, to provide the densest and most conductive wiring pattern possible. The second essential function is t house and protect the semiconductor integrated circuit device that the wiring pattern serves. These functions are limited by the intrinsic electrical and physical properties of the materials and by defects introduced during processing.

For the substrate structure, alumina is the dielectric material of choice for most packaging applications because of its relatively low cost with respect to its intrinsic properties; to achieve properties in the dielectric portion approaching those intrinsic to the material requires achieving a high density, essentially pure substrate. The art has resorted to the addition of minor amounts (generally 2-6 wt. %) of glass in the dielectric composition to promote liquid phase sintering at about 1500° C. Such glass compositions are typically an aluminosilicate or aluminate (e.g., U.S. Pat. No. 4,835,039 (filed 26 Nov. 1986, Ser. No. 935,264), U.S. Pat. No. 4,734,233, and U.S. Pat. No. 4,678,683, all incorporated herein by reference). More recently, the art has moved to pure alumina substrates, essentially glass free, as described, for example, in the present assignee's U.S. Pat. No. 4,769,294.

The choice of an electric material depends, in part, on the method chosen for fabrication of the package. Thick film techniques involve providing a paste or ink from sinterable particles and an organic vehicle; the ink is then screen-printed onto the substrate in the desired circuit pattern and fired to yield a circuit path. The sinterable particles are generally metallic copper for conductive circuit paths, and are other materials if it is desired to provide capacitors, resistors, and similar electronic components.

However, a drawback to essentially pure alumina substrates is that they require sintering at a much higher temperature than those with glass; pure alumina substrates generally sinter at 1550°-1650° C., while copper, gold, and silver sinter at less than about 1000° C. This temperature difference is not important unless co-sintering of the dielectric and the conductor is desired; with such disparate sintering temperatures, the earlier sintering metallic component will become liquid and be drawn into the green dielectric layer. Co-sintering requires a more refractory metal, such as tungsten or molybdenum, which, with the addition of sintering aids, sinters at about the same temperature as alumina; unfortunately, refractory metals are pool electrical conductors. Therefore, co-sintering requires a compromise in the electrical properties of the package.

Rather than co-sintering, simpler and less elegant postfired fired metallization techniques can be used. Generally, such methods are limited to making single layer devices that are densified, printed with a circuit pattern, and re-fired; low temperature sintering metals (e.g., copper) can be used in these methods because the dielectric is fully dense, and thus does not wick the metallization. Accordingly, these methods are limited to single layer geometries because lamination to a green layer will result in wicking of the non-refractory metal.

The advantages obtained from co-fired multilayer packages thus require resort to a refractory metal. Multilayer packages can be made by co-sintering a laminated array of green sheets having metallized electrical portions (as described by out U.S. Pat. No. 4,861,641, (Ser. No. 053,323, field 22 May 1987)) or by a post-firing process using a refractory metal-based ink, laminating, firing, and repeating as desired (as described, for example, in U.S. Pat. No. 4,289,719, which use glass in the dielectric portion).

An important consideration when pressureless sintering different materials into an integral unit article, especially where the different materials include metal and ceramic, is differences in shrinkage and thermal expansion between the materials and the extent of those differences. One factor influencing whether shrinkage and thermal expansion differences are important is the relative geometries during co-sintering. For example, in the case where a metallizing composition is screen printed onto a substrate, the trace pattern is so significantly thinner than the substrate and is spread out over such a large area that the shrinkage and expansion characteristics of the substrate will dominate. Such behavior is generally applicable where the metallization is densified in a post-firing operation; in a co-firing operation, the metallization composition must be altered in an attempt to approximate the shrinkage of the green substrate to avoid excessive camber.

However, in the case of vias, thermal and shrinkage mismatch are more independent and can have catastrophic consequences. The thermal and shrinkage attributes interact much more in the geometry of a via than in the case of a very thin circuit trace. If the via composition shrinks more than the ceramic, it may pull away from the substrate. Accordingly, bonding of the metal t the ceramic is a primary concern (it is also a concern with circuit traces, but less so). If the via composition shrinks less than the substrate, the ceramic will likely fracture. After densification, thermal mismatch can have similar effects; e.g., upon cooling from the peak firing temperature, the metal may contract more than the ceramic, similarly precipitating cracks in the ceramic and/or fracturing the metal-to-ceramic bonding in the via hole.

Vias are typically formed in substrates for thin film application (i.e., trace patterns made by vapor deposition or sputtering) by "drilling" a hole in the substrate and then coating the inside of the hole with a thin layer of metal using lithography, vapor deposition, and plating processes. A typical via is therefore a hollow, metal coated conduit, often referred to as a "plated 'thru hole'". In actual production, the via is then filled with a resist material for further processing steps, such as the application of thin or thick film conductor patterns. After the subsequent processing, the resist material is etched out from the via, and the final article again has a hollow, metal coated conduit.

Because of the small tolerances (typically less than or equal to 2.0 mils absolute) in the hole position required for thin film processing, laser drilling of the via holes is commonly practiced; although laser systems provide precise hole positioning, many problems are associated with this method. Slag and other defects, such as microcracks, are often generated on the substrate around the via holes; these defects can degrade the adhesion and quality of the subsequently applied thin film metallurgy. The creation of such defects reduces reproduciblity of the laser drilled holes is, and thus the distribution of the electrical characteristics of the vias may be unacceptably broad; this results in lower process yields. After drilling, residual stresses around via holes generally remain through to subsequent processing; these latent stresses can cause fracture to the substrate during subsequent assembly operations, particularly during soldering. Latent defects that cause failure in the final assembly steps of an electronic subsystem can be very costly, orders of magnitude greater than the cost of the failed IC package. Although laser induced stresses may be reduced by heat treating prior to metallizing, the product quality is still less than desirable.

Vias are also used to facilitate heat transfer away from the silicon die (i.e., semiconductor integrated circuit device). Metal, being a better thermal conductor than ceramic, is used in the vias as a thermal conduit. Thus, in connection with the function of the package to house and protect the IC, the package must facilitate rapid heat transfer away from the IC chip.

In this regard (to house and protect the IC), hermiticity of vias is also an important consideration. It is very difficult to fabricate a via that is both completely ($\geq 99\%$) dense and also hermetic; hermiticity is usually determined by a helium leak rate test, with leak values not greater than $10^{-8}$ cc/sec being acceptable. However, it is important to note that for a single substrate or package having multiple vias, a hermiticity failure in any single via makes the entire package non-hermetic. Accordingly, the art commonly practices making the entire package hermetic by providing an integral metal plate on the back, typically by screen printing or plating (the plate is often used as an electrical ground plane); this, to a large extent, obviates the need for individual via hermeticity.

It would be beneficial to provide a via composition, for both cofire and post-fire applications, having improved bonding characteristics and improved shrinkage characteristics more closely approximating those of the ceramic, whereby stronger, more crack-free IC packages could be fabricated. It would also be advantageous to provide a via composition having good electrical and thermal conductance which can also be con-sintered with the ceramic; generally, if the ink can be co-sintered it can be post-fired (the converse not necessarily being so true). It would also be valuable to provide hermetic vias having these desired characteristics.

SUMMARY OF THE INVENTION

This invention relates to a composition and process for producing via improved from those disclosed in the co-pending application Ser. No. 053,323 including bonding additives as described in co-pending application Ser. No. 207,394, both applications incorporated herein by reference.

In general, this invention provides an improved method and ink composition for the fabrication of hollow, metal coated vias. More importantly, this invention provides an improved method and composition for dense metal vias fabricated by cofiring techniques; the compositions and aspects of the method are also suitable for the less-elegant post-firing techniques for making dense vias.

The present invention provides a solids composition for producing a co-fired vias in a pure alumina substrate comprising 80–97% of a refractory metal, 2–15% alumina, 0.05–5% of a sintering aid, and 0–5% of a bonding additive, all amounts by weight. This composition essentially describes the as-fired via, and is suitable as a basis for a thick film printable ink further including an organic vehicle for forming the via. For via ink formulations, the solids composition is present at 40–50% by volume and the vehicle is present at 60–50% by volume.

This invention also provides a process for producing dense co-fired vias in pure alumina substrates including the steps of providing a green alumina substrate, forming via through-holes in the green substrate, filling the via holes with the ink just described to form a green composite can be reduced by the further processing step of cooling at a rate of not greater than about 300° C./hr. in the temperature range of about 100°–500° C. when cooling from the peak firing temperature to room temperature.

The present invention also provides an improved via composition including a porous refractory metal substantially filled with a more conductive metal (such as copper and/or gold) by an infiltration method. This via composition is fabricated first by providing a metallization composition having a solids portion including 80–97% refractory metal, 2–15% alumina, and 0–5% bonding additive, the solids portion being dispersed in an organic vehicle in an amount of about 20–30% by volume. The processing method for producing hermetic, infiltrated vias includes providing a green substrate, forming via holes in the substrate, filling the via holes with a refractory metal ink to form a composite, and co-sintering the composite to yield a dense substrate with porous refractory metal vias. Thereafter, the porous vias are filled with a more conductive metal, such as copper, by filling the porous vias with an ink and firing or by using solid copper and firing to cause the copper to melt (reflow) to fill the interstitial voids in the porous via; generally, a final machining process is necessary to produce a substrate having a smooth surface.

In all cases, the metallization composition should not contain silicate-based bonding agents, as silica is known to promote grain growth in alumina during sintering.

While not a preferred embodiment, these ink compositions and various aspects of the methods are suitable for fabricating the same articles by post-firing techniques. For example, the substrate can be sintered, vias can be laser drilled, the vias can be filled with the composition suitable for firing to a porous via, and the via can then be filled with a more conductive metal, or post-fired metallization can include both the fabrication of a porous tungsten via and infiltration to produce a dense, hermetic via.

DESCRIPTION OF PREFERRED EMBODIMENTS

Figure 1:
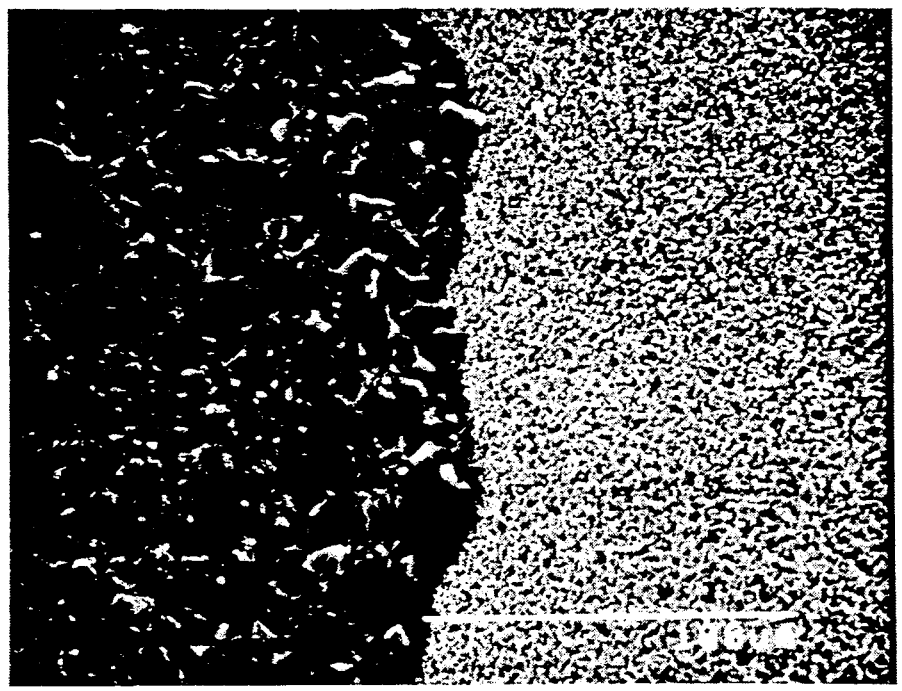
FIG. 1 is a SEM fracture surface of a microporous tungsten via prior to infiltration.

The present metallization compositions generally include a refractory metal, alumina, a sintering aid, and a bonding additive; inks for porous refractory vias (for infiltration) and bore-coating are formulated without the sintering aid. These compositions are suitable for co-sintering with ≧96% alumina; preferably the substrates are ≧99% or even ≧99.5% alumina (impurities and a small amount of a sintering aid typically account for the remaining 0.5%). As used herein, the term "alumina" is intended to mean an essentially glass-free composition (i.e., ≦1 wt. % glass). The inks are composed of 80-97% refractory metal, 2-15% alumina, 0-5% sintering aid, and 0-5% bonding additive (all amounts are by weight unless otherwise noted). Just as with the substrate, the present inks are to be essentially devoid of glass.

The refractory metals are typically tungsten, molybdenum, and mixtures thereof, generally provided in the form of a powder; other conventional refractory metals such as titanium, hafnium, niobium, chromium, manganese, and rhenium can be used. Exemplary refractory powders are tungsten powders designated M-5, M-10, M-20, and M-40, available from GTE Sylvania, Powanda, Pa. These powders have average particle sizes of approximately 0.3 micron, 0.6 micron, 1.0 micron, and 3 microns, respectively.

The sintering aid, which enhances the densification of the refractory metal during sintering, can be from among nickel, cobalt, palladium, manganese, the oxides thereof, and mixtures thereof, as typically known in the art. Sintering can also be enhanced by using finer particle sizes (as discussed below concerning shrinkage match) and by pre-reducing the refractory powder (i.e., removing any oxide components, which often form upon exposure to air) prior to formulating the metallization composition. Improved sintering provides greater hermeticity (i.e., the sealing of gases from the substrate) and improved metallization bonding strength. Nickel is a preferred sintering aid in an amount of 0.1 parts to 0.4 parts on a 100 parts refractory metal weight basis.

Even though the sintering aid facilitates sintering of the refractory metal at the sintering temperature of the alumina substrate, it is necessary to control the shrinkage of the metallization. Accordingly, it is preferred to use a combination of commercially available powders that results in a sintering curve for the metal approximating that of the substrate: i.e., such that the degree of sintering, as evidenced by the amount of shrinkage, over a firing schedule is closely approximated for both the substrate and the metallization. Experimentally, shrinkage evaluation can be performed by making pellets of each of the tape and ink compositions and measuring the shrinkage of each over the period of the firing schedule. The powders used in the ink composition can then be varied as required: generally, increasing the average particle size will delay sintering and decreasing the average particle size will hasten sintering.

The bonding additive can be molybdenum oxide, tungsten oxide, niobium oxide, magnesium oxide, yttrium oxide, manganese oxide, titanium dioxide, or mixtures thereof, such as magnesium titanate; yttrium oxide, in amounts of 0.75-3.0 wt. %, and magnesium titanate and titanium dioxide, in amounts of 0.5-3.0 wt. %, are preferred. Bonding additives are also described in detail in the above-mentioned application Ser. No. 207,394, incorporated herein by reference.

The composition also includes alumina in an amount of about 2-15%. While not desirous of being constrained to a particular theory, it is believed that the alumina further enhances the function of the bonding additive due to the formation of a new phase (e.g., $Al_2TiO_5$, $MgAl_2O_4$) at the metal-ceramic interface, and it may also be that formation of a new phase occurs between the metallization and alumina in the substrate even in the absence of alumina in the metallization formulation. Still further, the presence of alumina in the metallization compositions, especially for particles sizes similar to those from which the substrate is derived, appears to further aid in matching the shrinkage of the metallization to that of the alumina substrate during co-sintering. Even further, it has unexpected been discovered that if the alumina content is sufficiently high, generally greater than about 12%, then the bonding additive may be omitted entirely (12 wt. % generally represents an amount of about 45% by volume based on the tungsten inks illuminated in the examples).

Post-filled, post-firing techniques can include using the same refractory metallization as just described (but processed in a post-firing process) or, more preferably, include providing a porous tungsten via and filling the porosity with a more ductile, more conductive metal, an infiltration process; as described in the aforementioned application Ser. No. 053,323, post fired metallization can include infiltrating a porous tungsten via or merely filling a bore-coated via.

For post-filled, post-firing infiltration applications, conventional inks and braze alloys can be used for infiltration or post-firing. Preferred are those available from GTE Wesgo, Belmont, Calif. (e.g., under the descriptions copper (OFHC), gold, 40% gold/60% copper, silver, and CUSIL (72% Ag/28% Cu)). It is important to note than in all cases where the via includes tungsten metallization, the post-processed metallization should be devoid of nickel; nickel promotes the liquid phase sintering of tungsten and thus bore coated tungsten migrates from the via wall into the post-processing metallization. In general, the post-processed metallization can be any metal or alloy that (i) sinters at a temperature less than that of the refractory metallization, (ii) for filling porous vias, fills the void space, and (iii) is non-reactive with the refractory metal (either bore-coated or infiltrated). Preferably, these include copper, gold, silver, and mixtures and alloys thereof, including those with palladium, cobalt, indium, titanium, tin, manganese, and mixtures thereof.

The present compositions are typically provided in the form of flowable inks, generally including the above-described components in a dispersion vehicle. The vehicle preferably includes a solvent, a dispersant and, optionally, a viscosity modifier and/or plasticizer.

Exemplary solvents include: alcohols, such as methanol, ethanol, α-terpineol, and butylcarbitol acetate; methylethyl ketone (MEK); hydrocarbons, such as benzene and toluene; and the like known in the art, including mixtures thereof. The solvent is present to facilitate mixing and is subsequently removed either actively by heating or passively by evaporation during mixing. Also, α-terpineol and butylcarbitol acetate (referred to hereinafter as BCA) have relatively slow evaporation rates, and thus can also function as viscosity modifiers (discussed below).

Exemplary dispersants include: polymeric polyelectrolytes, such as those based on acrylic acid and including sodium and/or ammonium salts (e.g., NARLEX LD-42 and LD-45, available from National Starch Co., Bridgewater, N.J., and DARVAN C and 821A, available from R. T. Vanderbilt & Co., Norwalk, Conn.); sodium, potassium, or ammonium polyphosphates and pyrophosphates; amines, such as di- or trialkylamines (e.g., eiethylamine, tripropylamine), di- or trialkanolamines (e.g., triethanolamine), N,N-diethylethanolamine, polyethylene imines (e.g., Corcat P-600 (MW=600,000) and Corcat P-12 (MW=12,000), available from Virginia Chemical, Portsmouth, Va.), morpholine, and other amine dispersants known in the art; polyelectrolytes including quaternary ammonium salts (e.g., EMCOL CC-55 and CC-42, available from Witco Chem. Corp., Houston, Tx.); polyethylene glycols and polyoxyalkylene derivatives of propylene glycol (e.g., Pluronic L-12, available from BASF-Wyandotte Corp., Parsippany, N.J.); polyvinylpyrrolidone; vinylacetates; and the like, and compatible mixtures thereof. Other dispersants and dispersion technology is further described in co-pending applications Ser. Nos. 856,803 (filed April 1986), 045,684 (filed 01 May 1986), 036,377 (filed 09 April 1987), and 242,726 (field 09 Sept. 1988), all of which are incorporated herein by reference.

Exemplary viscosity modifiers include polyvinyl alcohol, cellulose derivatives (e.g., ethycellulose derivatives such as those designated EC, available from Hercules, Inc., Wilmington, Del.; methylcellulose; cellulose ethers such as that designated METHOCEL, available from Dow Chemical, Midland, Mi.), glycols such as polyethylene glycol and methoxypolyethylene glycol (e.g., Carbowax, available from Union Carbide, New York, N.Y.), α-terpineol, butylcarbitol acetate (BCA), and the like, and mixtures thereof. Exemplary plasticizers are phthalate esters and mixtures thereof; a preferred plasticizer is SANTICIZER 160 brand butyl benzyl phthalate (available from Monsanto, St. Louis, Mo.).

Ink formulations are typically applied by a screen printing method. The viscosity of the formulation can be varied as desired; typically, trace inks have a lower viscosity and via inks have a higher viscosity (so that the applied ink remains in the via hole). Solids loadings for the inks can range from about 25 vol. % solids to about 50 vol. %, most preferably about 40–45 vol. %; at lower loadings the sintered metallization becomes more porous, and at higher loadings (especially with a dense powder such as tungsten), providing an ink that is easily printable becomes much more difficult. In general, the volume ratio of the non-volatile organics to the sinterable solids effects the green density of the metallization, which thereby effects the shrinkage upon sintering. For dense, co-fired vias, the non-volatile organics should be present in via inks at about 45% to 65% by volume, preferably 49.5% to 59.5%, most preferably 52% to 55%.

Specific embodiments of the invention are further described by the following examples, which are meant to be illustrative and in no manner limiting.

EXAMPLE I

A co-sintered composite having dense vias was made by first fabricating a screen printable ink comprising:

| (1) As the solids portion: | | |
|---|---|---|
| Tungsten M-40 | 13.7 g. | 13.79 wt. % |
| Tungsten M-20 | 28.7 g. | 28.89 wt. % |
| Tungsten M-10 | 43.7 g. | 43.99 wt. % |
| Alumina A16 | 12.0 g. | 12.08 wt. % |
| Manganese Oxide | 1.0 g. | 1.01 wt. % |
| Nickel | 0.25 g. | 0.25 wt. % |
| (2) As the vehicle: | | |
| 26 wt. % ethyl cellulose in butyl carbitol acetate | | 11.5 g. |
| plasticizer | | 3.0 g. |
| dispersant | | 4.0 g. |

"A16" is a trademark for alumina ($Al_2O_3$) powder available from Aluminum Co. of America, Alcoa Center, PA.
The dispersant was EMCOL CC-55 and the plasticizer was SANTICIZER 160, both as described above.

A green alumina tape was fabricated from a slip composed of alumina powder (available from Ceramics Process Systems Corp., Cambridge, Mass., under the designation CPS-2, having an average particle size of 0.5–0.8 micron) and 42 vol. % of a conventional polymeric binder (e.g., a polyvinyl butyral resin such as those available from Monsanto, St. Louis, Mo. under the designation BUTVAR, preferably BUTVAR B-90), and minor amounts of plasticizer and dispersant. The slip was tape cast by conventional methods in thicknesses of both 8 mils and 14 mils. Preferred tape casting methods are those described in U.S. Pat. No. 4,769,294 and in this assignee's co-pending application Ser. No. 135,320, filed 27 Nov. 1987, both incorporated herein by reference. A plurality of via holes were punched in the tape on 150 mil centers, each via having an inner diameter of about 16 mils.

The ink composition was screen printed into the via holes to produce a green composite. Green composites were then laminated into 4-layer packages and then sintered at about 1520° C. in a 50:50 $H_2/N_2$ atmosphere using a 44° C. dewpoint for about 2 hours at peak firing temperature to produce dense, co-fired vias.

EXAMPLE II

Following the procedure of Example I, an ink composition was prepared from a solids portion composed of:

| | | |
|---|---|---|
| Tungsten M-40 | 12.7 g. | 12.78 wt. % |
| Tungsten M-20 | 27.7 g. | 27.88 wt. % |
| Tungsten M-10 | 42.7 g. | 42.98 wt. % |
| Alumina A16 | 15.0 g. | 15.10 wt. % |
| Manganese Oxide | 1.0 g. | 1.01 wt. % |
| Nickel | 0.25 g. | 0.25 wt. % |

The organic vehicle was the same as in Example 1. The general procedure described in the previous example was used for punching, printing, laminating, and firing.

EXAMPLE III

Following the method used in the previous examples, a via ink was made using the following solids composition:

| Tungsten M-40 | 15.7 g. | 15.82 wt. % |
| Tungsten M-20 | 30.7 g. | 30.93 wt. % |
| Tungsten M-10 | 45.7 g. | 46.05 wt. % |
| Alumina A16 | 5.9 g. | 5.94 wt. % |
| Magnesium Titanate | 1.0 g. | 1.01 wt. % |
| Nickel | 0.25 g. | 0.25 wt. % |

In this example, magnesium titanate (MgTiO$_3$) is substituted for the manganese oxide bonding additive.

In this example, the ink was screen printed onto a green substrate as a circuit pattern and cofired as described above.

The following presents an embodiment of the invention wherein there is no bonding additive.

EXAMPLE IV

Following the same general technique as in the above examples, an ink was provided having a solids portion composed of:

| Tungsten M-40 | 13.7 g. | 13.93 wt. % |
| Tungsten M-20 | 28.7 g. | 29.18 wt. % |
| Tungsten M-10 | 43.7 g. | 44.43 wt. % |
| Alumina A16 | 12.0 g. | 12.20 wt. % |
| Nickel | 0.25 g. | 0.25 wt. % |

Using a similar vehicle composition, this ink was printed into vias punched in an 11×11 array into green alumina sheets. The sheets were then laminated to make a four-layer green composite, which was then sintered as in the previous examples.

EXAMPLE V

Figure 3:
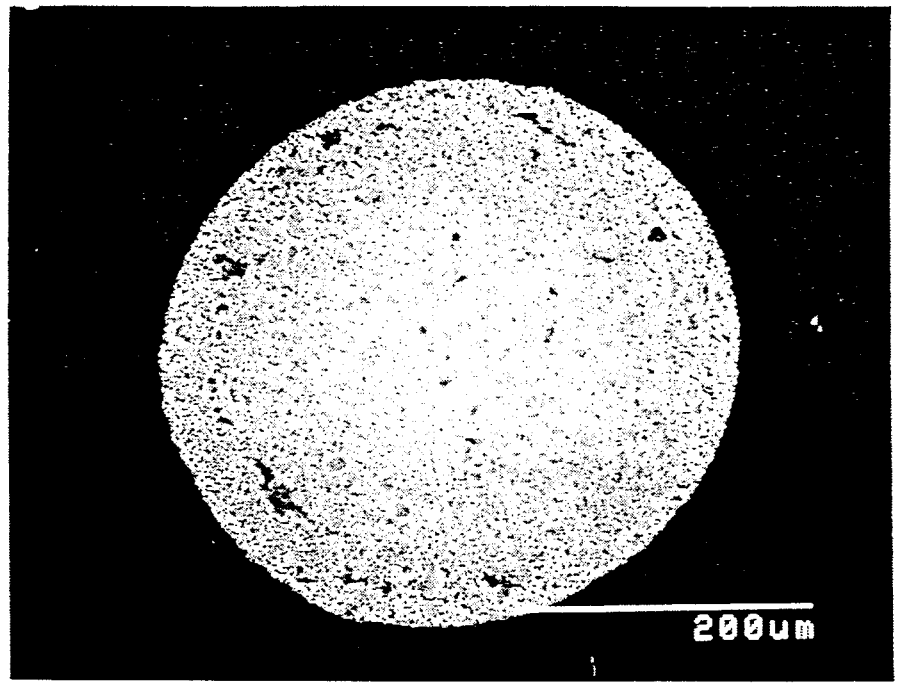
FIG. 3 is a polished surface of a copper filled tungsten via.
Figure 4:
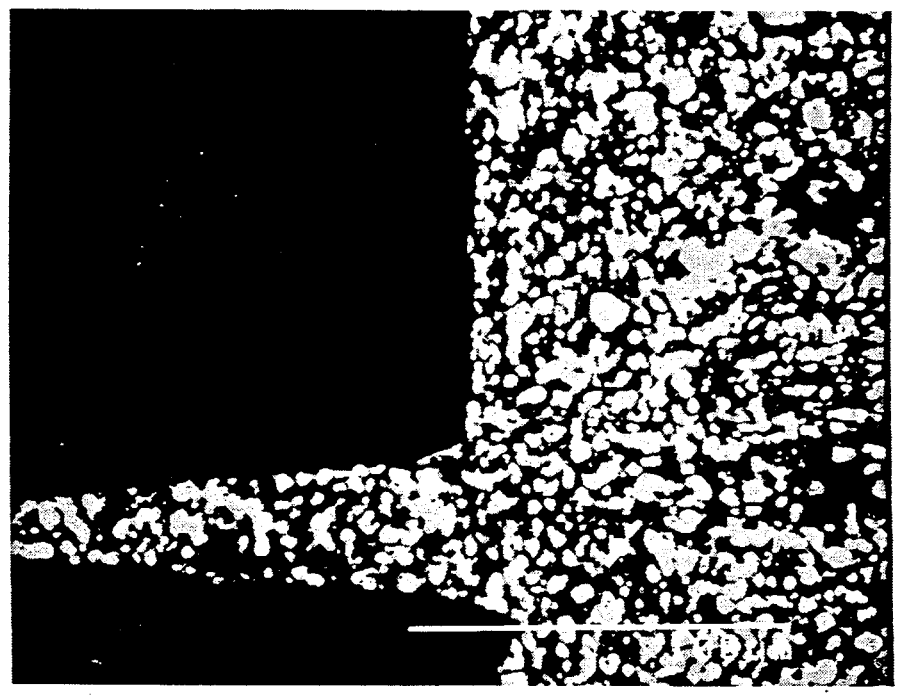
FIG. 4 is a polished surface of a co-fired via.

An ink was formulated using the previous methods. The solids portion was essentially identical to that used in Example IV. The vehicle was composed of 23 g. of 26 wt. % ethylcellulose in butyl carbitol acetate, 3 g. of plasticizer and 4 g. of dispersant (both as in Example I). This ink was screen printed into vias punched in the green tape and co-sintered to produce a dense, strong, well-bonded via. A co-sintered via of this type is shown in FIG. 3, an SEM of a polished surface (the lighter portion to the right being the metallization, the darker portion to the left being the alumina substrate).

It has been found that cracks can develop in the sintered alumina during cool down from the peak firing temperature. While not desirous of being constrained to a particular theory, it is believed that these cracks, especially since they are in the shape of radical starbursts, are due to thermal mismatch between the vias metal and the ceramic substrate during cooling. Additionally, it appears that the most critical temperature range where the thermal mismatch disparity may be most detrimental is from about 500° C. to about 100° C. Cool down should generally be as rapid as possible without subjecting the sintered article to undo thermal stresses. Unexpectedly, it has been found that a cooling rate of not greater than about 300° C./hr. while the article is cooling through the temperature range of 100° C. to 500° C. greatly reduces and appears to eliminate cracking caused by thermal mismatch. Articles processed by this method not only are crack free as determined by dye penetration techniques but also survive rigorous thermal testing (MIL-STD-883, thermal cycle method 1010.5, condition C, and thermal shock method 1011.4, condition C; both at −65° C. to +150° C.).

The infiltration method for producing dense, hermetic vias employs post-fire metallization steps to fill intentional porosity in the co-sintered refractory metallurgy, thus eliminating the need for more cumbersome methods to achieve hermeticity. The infiltrated metals are ductile, and hence may reduce stresses around vias caused by thermal expansion mismatch between the ceramic and the metallization. FIG. 1 is an SEM fracture surface of a tungsten via having microporosity; the left and darker portion is the alumina substrate and the right and lighter portion is the via.

For the infiltration method, the refractory metallization should bond well with the ceramic but should not sinter to a high density during co-firing; continuous, open porosity is preferred. It is preferred that the peak temperature yield vias having a density between 45% and 80% of theoretical (i.e., 55% to 20% open porosity). Alumina is a preferred substrate material, although other ceramic materials may also be suitable. Examples of other preferred substrate materials include, but are not limited to beryllia, zirconia, alumina-based composites such as SiC whisker reinforced alumina and zirconia-toughened alumina (ZTA), aluminum nitride, boron nitride, and silicon carbide.

After co-firing, a metal coating may be applied to a surface of the substrate by such methods as plating (electroless plating is preferred). The coating can also be provided by screen printing and re-firing, although the resulting coating usually has residual porosity; accordingly, multiple printings and firings may be required. The metal coating is usually used as a ground plane in the final device, and it also facilitates hermetic sealing of the vias. Typical coatings are based on tungsten, molybdenum, nickel, tungsten-titantium, aluminum-silicon-titanium-tungsten, and others; these typically include minor amounts of a sintering aid to promote full densification (especially for hermetic vias).

Next, an infiltrating metal is physically applied to the porous vias. The infiltrating material may be in the form of a solid sheet, a preform, or a printable ink; solids metals (e.g., a sheet, metal shot) are preferred. Infiltrating materials may be selected from a wide range of metals and/or alloys, including, but not limited to, nickel, palladium, cobalt, silver, copper, gold, alloys thereof, and mixtures thereof. Preferred alloys include 72 Au/28 Cu, 82 Au/18 Ni, 72 Ag/28 Cu, 80 Au/20 Cu, and 81.5 Au/16.5 Cu/2 Ni.

Figure 2:
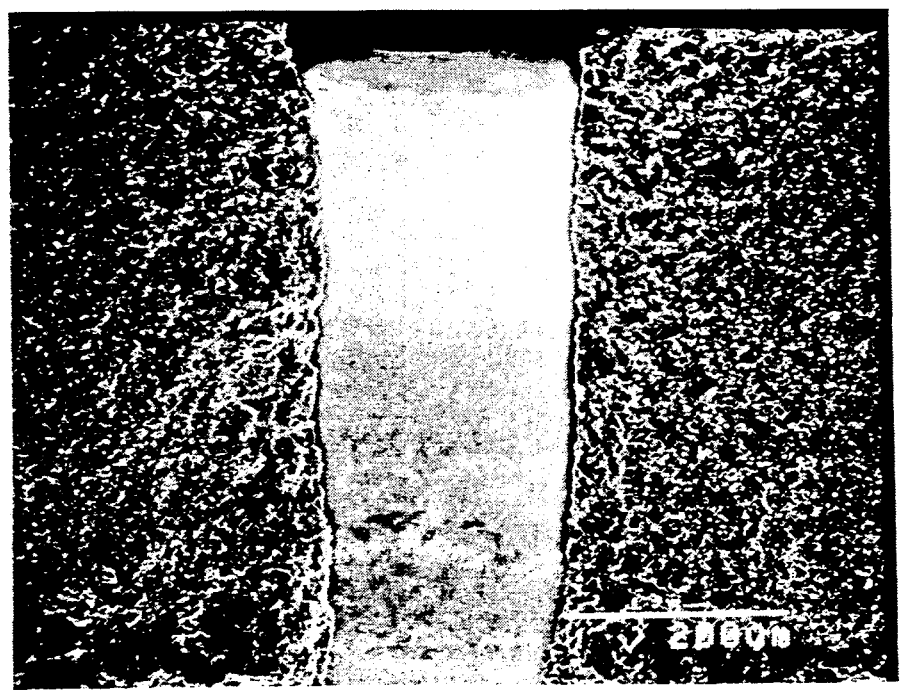
FIG. 2 is a fracture surface of a copper infiltrated porous tungsten via in an alumina substrate.

Following the physical application of the infiltrating material, the composite piece is heated to melt the infiltrant, preferably in a non-oxidizing atmosphere; it has been found that the formation of an oxide layer on the infiltrant metal surface decreases the wetability of the infiltrant to the refractory metal. Sometimes, complete densification of the via is not achieved using this procedure, but this process may be repeated as necessary to ensure the desired density and hermeticity. FIG. 2 is an SEM fracture surface of a tungsten via infiltrated with copper. FIG. 3 is a top-down view of a polished surface of an infiltrated porous via; compared with FIG. 1, infiltration of the porous tungsten network with copper is clearly shown.

The above-described refractory ink compositions are suitable, and preferred, for the fabrication of porous vias. When used as such, the solids portion is essentially devoid of a sintering aid; what is desired is a porous network that is well-bonded to the ceramic substrate. Thus, the absence of a sintering aid results in a porous structure, and the presence of a bonding addition promotes the desired bonding to the ceramic. The solids portion of the ink or via will then be comprised of 80-97% refractory metal, 2-15% alumina contents greater than about 12% a bonding additive is not essential. When formulated as an ink, the solids portion will be present at about 20-30% by volume and the remainder composed of the vehicle.

In an alternative embodiment, the green substrate may have vias punched and then sintered without metallization in the vias. The vias are then bore-coated, first with a sputtered or plated metal layer, and then a thick film conductor ink containing a refractory metal is pulled or sucked through the vias to further coat the inner surface. The resulting composite is fired to form a dense adherent layer within the vias. Subsequent processing includes filling the vias with an infiltrating material (such as a copper ink) as previously described.

In yet another embodiment, the green substrate may be first sintered to a dense substrate and thereafter via holes are provided by laser or ultrasonic drilling. Subsequent processing for bore-coated, dense, or infiltrated vias, all as described above, are then performed.

After the dense vias are formed by infiltration, subsequent lapping and polishing process may be desirable, depending on the specific application.

The foregoing disclosure and embodiments are not meant to be limiting but instead to describe and exemplify the present invention. Various modifications, additions, deletions, and the like may be readily apparent to the skilled artisan, and such are intended to be within the scope and spirit of the invention as defined by the following claims.

What is claimed is:

1. A package device comprising a substrate and a via in the substrate, the via having a refractory solids composition comprising 80-97% refractory metal, 2-15% alumina, 0-5% sintering aid, and 0-5% bonding additive, and being essentially glass-free.

2. The package device defined by claim 1, wherein the refractory metal is selected from the group consisting of tungsten, molybdenum, manganese, titanium, hafnium, niobium, chromium, rhenium, and mixtures thereof.

3. The package device defined by claim 1, wherein the sintering aid is selected from the group consisting of nickel, cobalt, palladium, manganese oxide, titanium dioxide, magnesium titanate, and mixtures thereof.

4. The package device defined by claim 1, wherein the bonding additive is selected from the group consisting of molybdenum oxide, tungsten oxide, niobium oxide, magnesium oxide, yttrium oxide, manganese oxide, titanium dioxide, magnesium titanate, and mixtures thereof.

5. The package device defined by claim 1, the refractory solids composition consisting essentially of no sintering aid and wherein the solids composition fills 80-50% by volume of the via and the via has 20-50% open porosity.

6. The package device defined by claim 5, the refractory solids composition consisting essentially of at least 12% alumina, no bonding additive, and no sintering aid.

7. The package device defined by claim 5, the via further comprising an infiltrated metal selected from the group consisting of nickel, palladium, cobalt, silver, copper, gold, alloys thereof, and mixtures thereof, and wherein the infiltrated metal fills the porosity.

8. The package device defined by claim 5, wherein the via further includes an infiltrated metal and exhibits a helium leak rate of not greater than $10^{-8}$ cc/sec.

9. The package device defined by claim 1, further comprising a non-porous metal coating on the inner diameter surface of the via, the metal coating composition comprising a metal selected from among tungsten, molybdenum, nickel, tungsten-titanium, aluminum-silicon-titanium-tungsten, alloys thereof, and mixtures thereof.

10. The package device defined by claim 1, wherein the refractory solids composition defines a coating on the inner via wall.

11. The package device defined by claim 1, wherein the refractory metal is derived from a powder effective to approximate the shrinkage of the substrate during sintering.

12. The package device defined by claim 1, wherein the substrate is alumina and the alumina in the via solids has essentially the same particle size distribution as that for the substrate.

13. The package device defined by claim 12, wherein the via is dense and co-sintered.

14. A process for producing a substrate having dense metallized vias, comprising the steps of:
  (a) providing a substrate;
  (b) providing at least one vias through-hole in the substrate;
  (c) filling the vias through-hole with a metallization composition effective to produce a porous vias upon sintering;
  (d) firing the metallization composition to produce a porous meal via;
  (e) physically applying a second metallization composition to the porous metal via;
  (f) heating the substrate having the second metallization composition applied thereto effective to infiltrate the second metallization into the pores of the porous metal via to produce a substrate having dense metallized vias.

15. The process defined by claim 14, further comprising the step of sintering the substrate prior to step (b).

16. The process defined by claim 14, further comprising the step of sintering the substrate prior to step (c).

17. The process defined by claim 14, further comprising the step of providing a dense metal coating to a surface of the substrate.

18. The process defined by claim 17, wherein the coating step is provided prior to step (d).

19. The process defined by claim 17, wherein the coating step is provided prior to step (e).

20. A process for producing a dense, co-fired via, comprising: (a) providing a green tape having a solids composition of at least 96% alumina; (b) forming at least one via in the tape; (c) filling the vias with a refractory metal composition essentially devoid of glass to produce a green composite; (d) co-sintering the green composite; and (e) cooling the co-sintered composite from a peak firing temperature to room temperature through a temperature regime of 500° C. to 100° C., the cooling rate through the regime not greater than about 300° C./hr., effective to produce a crack-free alumina substrate having dense, co-sintered vias therein.

* * * * *